United States Patent [19]
Iizuka et al.

[11] Patent Number: 4,559,548
[45] Date of Patent: Dec. 17, 1985

[54] CMOS CHARGE PUMP FREE OF PARASITIC INJECTION

[75] Inventors: Tetsuya Iizuka, Kawasaki; Hisashi Hara, Kamakura, both of Japan

[73] Assignee: Tokyo Shibaura Denki Kabushiki Kaisha, Japan

[21] Appl. No.: 364,639

[22] Filed: Apr. 2, 1982

[30] Foreign Application Priority Data

Apr. 7, 1981 [JP] Japan .................................. 56-52032
Apr. 7, 1981 [JP] Japan .................................. 56-52033

[51] Int. Cl.$^4$ ...................... H01L 27/04; H01L 29/78; H02M 7/19
[52] U.S. Cl. ............................... 357/23.6; 307/296 R; 357/42; 357/51; 363/60
[58] Field of Search ............... 357/42, 51; 307/296 A, 307/296 R, 304; 363/59, 60; 365/226

[56] References Cited

U.S. PATENT DOCUMENTS

| | | | |
|---|---|---|---|
| 4,233,672 | 11/1980 | Suzuki et al. | 357/42 |
| 4,255,677 | 3/1981 | Boonstra et al. | 357/23 C |
| 4,377,756 | 3/1983 | Yoshihara et al. | 307/296 R |

FOREIGN PATENT DOCUMENTS

| | | | |
|---|---|---|---|
| 54-107128 | 8/1979 | Japan | 357/42 |
| 55-59757 | 5/1980 | Japan . | |
| 55-107255 | 8/1980 | Japan . | |

OTHER PUBLICATIONS

Franz et al, IBM Tech. Discl. Bulletin, vol. 11, No. 10, Mar. 1969, p. 1219.

Shimohigashi et al., "An N-Well CMOS Dynamic RAM," International Electron Devices Meeting, Washington, D.C., pp. 835-836, Dec. 7, 1980, Technical Digest.

Primary Examiner—William D. Larkins
Attorney, Agent, or Firm—Finnegan, Henderson, Farabow, Garrett & Dunner

[57] ABSTRACT

A charge pump bias generator constructed of P channel MOSFETs in an N type substrate is used to provide a negative bias to a P well containing active N-channel MOSFET circuit elements to reverse bias the N type source to P well junctions. Since the charge pump uses P channel FETs in an N substrate with the N substrate connected to the positive power supply, parasitic minority carrier injection by the charge pump is prevented.

9 Claims, 10 Drawing Figures

CMOS CHARGE PUMP FREE OF PARASITIC INJECTION

BACKGROUND OF THE INVENTION

The present invention relates to a semiconductor device with a substrate bias generator.

There has been known a substrate bias generator which generates a voltage with an opposite polarity to that of a power source voltage externally supplied and supplies it to a substrate. A substrate bias generator is formed on a semiconductor substrate. FIG. 1 shows an example of the substrate bias generator using the charge pumping effect. As shown, a circuit for generating an alternating voltage (referred to as a generating circuit) 10 grounded at one end generates an AC voltage oscillating between the reference voltage $V_{SS}$ and the power source voltage $V_{DD}$. The other end of the generating circuit 10 is connected through a capacitor 12 for charge pumping to the source of an N channel MOS transistor 14. The gate and drain of the MOS transistor 14 are both connected to a terminal 16 connected to the substrate. A node between the generating circuit 10 and the capacitor 12 is denoted as N1 and a node between the source of the transistor 14 and the capacitor 12 is denoted as N2. The node N2 is connected to the gate and drain of an N channel MOS transistor 18 the source of which is grounded. The transistors 14 and 18 effects the rectification. The current rectified flows from the terminal 16 to ground through the node N2. The charge induced into the node N2 by means of the generating circuit 10 via the capacitor 12 is supplied from the terminal 16. The induced charge is discharged to ground through the transistor 18. Through the charge pumping action, a current flows from the terminal 16 to ground, so that the terminal (substrate) 16 is biased to a negative potential. FIG. 2 illustrates a structural diagram of the substrate bias generator shown in FIG. 1. A P type high concentration impurity region 22 and N type high concentration impurity regions 24, 26 and 28 are formed on the surface region of a P type silicon substrate (corresponding to the terminal 16 in FIG. 1). A gate electrode 32 is formed on the silicon substrate 20 between the N type high concentration impurity regions 24 and 26, with a gate insulating film 30 interposed therebetween. Another gate electrode 36 is formed on the N type high concentration impurity region 28 through a gate insulating film 34. The capacitor 12 is made up of the gate electrode 36, the gate insulating film 34 and the N type high concentration impurity region 28. The region 26, the electrode 32 and the region 24 serve as the source, gate and drain of the MOS transistor 14, respectively. The impurity region 22 is a diffusion region for enhancing the ohmic contact with the silicon substrate 20. Other circuit elements such as a memory cell are formed on the P type silicon substrate 20. The transistor 18 in FIG. 1 is not shown in FIG. 2.

The prior substrate bias generator has the following disadvantages. The potential at the impurity region 26 (corresponding to the node N2 in FIG. 1) changes with a variation of the output voltage from the generating circuit 10. Accordingly, the potential of the impurity region 26 falls possibly below that of the silicon substrate 20. At this time, the PN junction (corresponding to the diode 38 indicated by a broken line in FIG. 1) between the silicon substrate 20 and the high concentrated impurity region 26 is forwardly biased. Therefore, a large amount of electrons are injected into the silicon substrate 20. Since the life time of the minority carriers in the P type substrate is long, the carriers move in the substrate to possibly enter the peripheral circuit elements, providing causes of an erroneous operation of the integrated circuit. Particularly the integrated circuit operating in a dynamic mode uses many nodes in a floating state and hence is easily influenced by the minority carriers. Also in the static circuit, the floating nodes are frequently used for reducing the power consumption of the integrated circuit. When the electrons as the minority carriers are diffused into the floating nodes, the circuit elements tends to erroneously operate.

In the case using the N type substrate, the holes enter the substrate to become the minority carriers, causing the erroneously operation of the circuit elements similarly.

SUMMARY OF THE INVENTION

Accordingly, an object of the present invention is to provide a substrate bias generator for use in a semiconductor device in which the number of minority carriers injected into the semiconductor substrate from the substrate bias generator are reduced.

In the present invention, a reference potential is applied to a semiconductor substrate of a first conductivity type into which a substrate bias generator has been formed, thus blocking the flow of minority carriers from the bias generator. A group of circuit elements formed in a semiconductor region of a second conductivity type in the semiconductor substrate receive the voltage generated by the bias generator.

With this arrangement, the number of minority carriers injected into the semiconductor substrate is reduced. As a result, the reliability of the semiconductor device is improved.

In addition, if a given potential is applied to the semiconductor substrate so that the PN junction formed between the semiconductor substrate and the bias generator is reverse biased, the charge pumping efficiency of the substrate bias generator can be improved.

BRIEF DESCRIPTION OF THE DRAWINGS

Other objects and advantages of this invention will become apparent from the following description taken in connection with the accompanying drawings, in which.

DETAILED DESCRIPTION OF THE PREFERRED EMBODIMENTS

Figure 1:
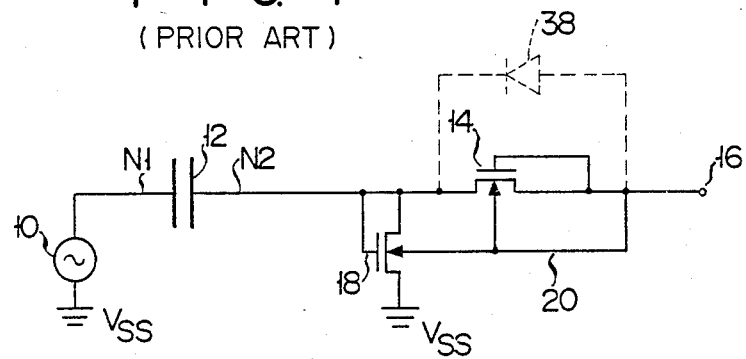
FIG. 1 is a circuit diagram illustrating a substrate bias generator used in a prior semiconductor device.
Figure 2:
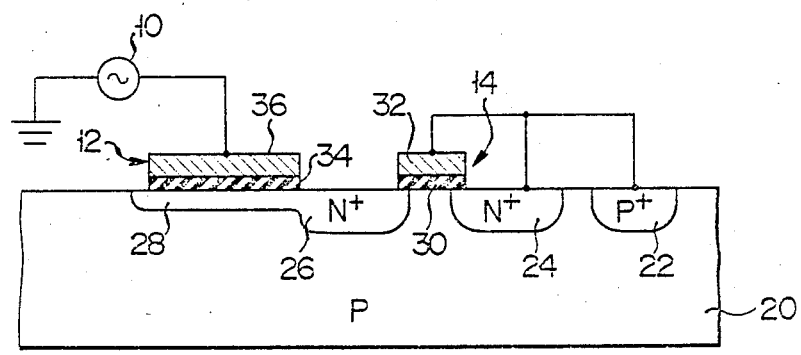
FIG. 2 is a cross sectional view of the prior semiconductor device shown in FIG. 1.
Figure 3:
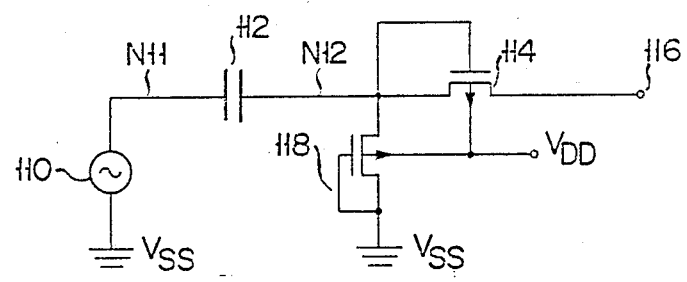
FIG. 3 is a circuit diagram of a substrate bias generator used in a semiconductor device according to the present invention.

FIG. 3 is a circuit diagram of a substrate bias generator in a semiconductor device according to the present invention. An AC voltage generating circuit 110 connected at one end to ground produces an AC voltage oscillating between a reference voltage $V_{SS}$ (ground potential in this case) and a power source voltage $V_{DD}$. The other end of the generating circuit 110 is connected to a terminal 116 through a capacitor 112 and a P channel MOS transistor 114. The terminal 116 is connected to a semiconductor region to be supplied with a voltage generated by the substrate bias generator. A node between the generating circuit 110 and the capacitor 112 is denoted as N11 and a node between the drain of the transistor 114 and the capacitor 112 is denoted as N12. The node N12 is connected to the source of a P channel MOS transistor 118 grounded at the gate and drain. The gate of the transistor 114 is connected to the node N12. The power source voltage $V_{DD}$ is applied to the substrate regions in which the channel of the transistor 114 is formed and the channel of the transistor 118 is formed. The transistors 114 and 118 both have a rectification characteristic. The current flows, due to the charge pumping action, from the terminal 116 toward the node N12 and from the node N12 toward ground. Accordingly, the terminal 116 is biased to a negative potential.

Figure 4:
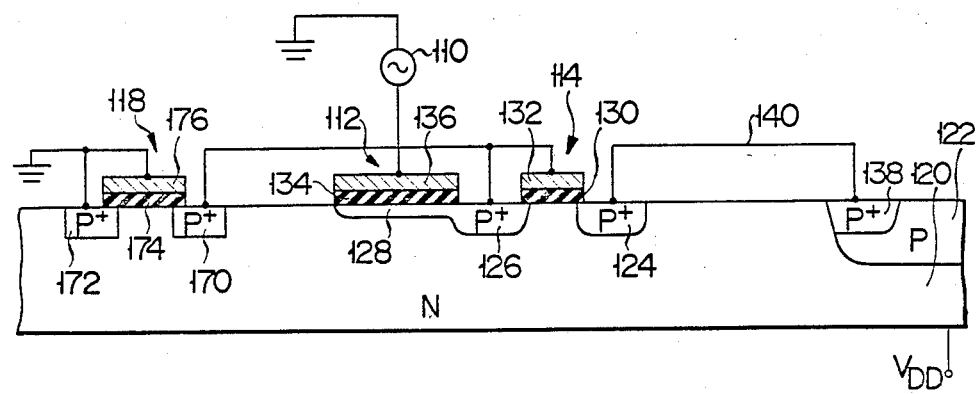
FIG. 4 is a cross sectional view of the semiconductor device shown in FIG. 3.

FIG. 4 illustrates, structurally and schematically, a semiconductor device with a substrate bias generator according to the present invention. A P type well region 122 (corresponding to the terminal 116) is formed on the surface of an N type silicon substrate (corresponding to the power source $V_{DD}$ supplying point in FIG. 3). Main circuits are formed in the P type well region 122. Accordingly, the well region 122 serves as the substrate for group of N channel MOS transistors. P type high concentration impurity regions 124, 126, 128, 170 and 172 are formed on the N type silicon substrate 120. The impurity regions 124, 126, 170 and 172 are formed in the same step of the fabricating process.

A gate electrode 132 is formed on the silicon substrate 120 sandwiched by the P type high concentration impurity regions 124 and 126 with the gate insulating film 130 interposed therebetween. The P type high concentration impurity region 124, gate electrode 132 and P type high concentration impurity region 126 form the source, the gate and the drain of the P channel MOS transistor 114 in FIG. 3, respectively. A gate electrode 136 is formed on the region 128 through a gate insulating film 134. The gate electrode 136, the gate insulating film 134, the P type high concentration impurity region 128 make up the capacitor 112 in FIG. 3. A gate electrode 176 is formed on the silicon substrate 120 sandwiched by the P type high concentration impurity regions 170 and 172, with the gate insulating film 174 intervening therebetween. The P type high concentration impurity region 170, the gate electrode 176, and the P type high concentration impurity region 172 form the source, the gate and the drain of the P channel MOS transistor 118 in FIG. 3, respectively. The P type high concentration impurity region 124 is connected to the P type high concentration impurity region 138 formed through an interconnection line 140 in the P type well region 122. The P type impurity region 138 is a diffusion region for enhancing the ohmic contact of the P well region 122 with the interconnection line 140. The gate electrode 132 of the MOS transistor 114 is connected to the P type high concentration impurity regions 126 and 170. The gate electrode 136 of the capacitor 112 is grounded through the AC voltage generating circuit 110. The gate electrode 176 and the high concentration impurity region 172 of the MOS transistor 118 are grounded. The N type silicon substrate 120 is biased to the power source voltage $V_{DD}$.

It is evident that other circuits can be formed on the N type silicon substrate 120, in addition to the substrate bias generator.

In the semiconductor device with such a construction, the power source voltage $V_{DD}$ is supplied to the N type silicon substrate 120, so that the PN junction formed by the P type high concentration impurity regions 126, 128 and 170, which corresponds to the node N12 in FIG. 3, and the N type silicon substrate 120 is always reverse-biased, unlike the prior art one. Therefore, no minority carriers are injected into the silicon substrate 120 and therefore the erroneous operation of the circuit elements never takes place.

The substrate bias generator further has the following advantages. In order to effectively operate the substrate bias circuit, it is necessary to transmit the AC voltage to the node N12 without any attenuation. In the structure of FIG. 4, a parasitic capacitor is formed between the node N12 and the silicon substrate 120 impressed with the power source voltage $V_{DD}$, so that the amplitude of the AC voltage is reduced. As the parasitic capacitor is smaller, the AC voltage can be transferred to the node N12 with less attenuation. The conventional parasitic capacitor is formed by the PN junction reverse-based with a voltage substantially corresponding to the threshold voltage of MOS FET. On the other hand, the parasitic capacitor of this invention is formed by the PN junction always reverse biased with a voltage substantially corresponding to the power source voltage. For this reason, the junction capacitance is extremely small. Therefore, the amplitude of the AC voltage generated at the node N12 can be large, thereby enhancing the charge pumping efficiency.

Figure 5:
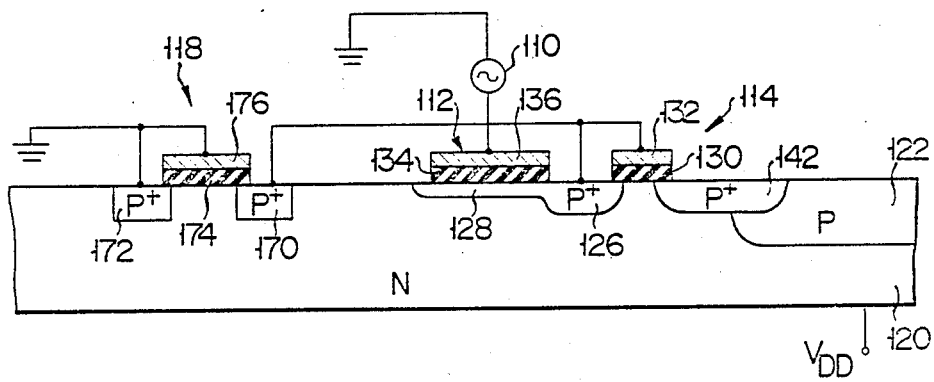
FIG. 5 is a cross sectional view of a second embodiment of a semiconductor device according to the present invention.

FIG. 5 shows a second embodiment of a semiconductor device according to the present invention. In the present embodiment, an impurity region 142 is formed which includes both the P type high concentration impurity region 124 and the P type high concentration impurity region 138 formed in the P well region 122 in FIG. 4. This feature improves the integration density of the semiconductor device.

Figure 6:
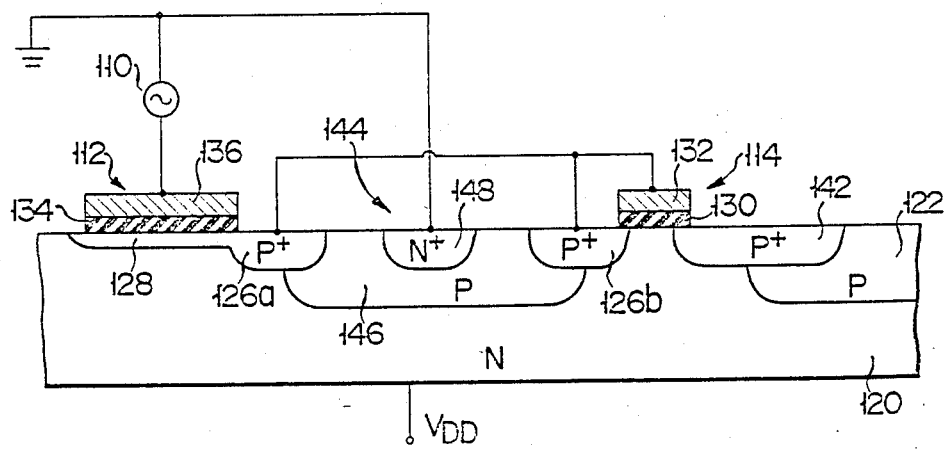
FIG. 6 is a cross sectional view of a third embodiment of a semiconductor device according to the present invention.

FIG. 6 shows a third embodiment of a semiconductor device according to the present invention. In the semiconductor device, the substrate bias generator is comprised of a capacitor 112, the MOS transistor 114, and the diode 144.

A P type well region 122 is formed on the surface of the N type silicon substrate 120. Major circuits are formed in the P type well region 122. Accordingly, the well region 122 serves as the substrate for a group of N channel MOS transistors. A P type well region 146 is formed on the N type silicon substrate 120. P type high concentration impurity regions 126a, 126b and 128, which are connected to the P type well region 146, and the P type high concentration impurity region 142 ranging to the N type silicon substrate 120 and the P type well region 122 are formed. The P type high concentration impurity regions 126a and 128 are formed integrally. The N type high concentration impurity region 148 is formed in the P well region 146. The gate electrode 132 is formed through the gate insulating film 130 on the silicon substrate 120 sandwiched between the P type high concentration impurity region 126a and the P type high concentration impurity region 142. The P type regions 142, the gate electrode 132, and the P type region 126b form the source, the gate and the drain of the P channel MOS transistor 114. The gate electrode 136 is formed on the P type region 128, through the gate insulating film 134. The capacitor 112 is formed of the gate electrode 136, the gate insulating film 134, and the N type region 128. The diode 144 is formed by the PN junction between the N type high concentration impurity region 148 grounded and the P type well region 146. The gate electrode 132 of the MOS transistor 114 is connected to the P type high concentration impurity regions 126a and 126b. The gate electrode 136 of the capacitor 112 is grounded through the AC voltage generating circuit 110. The N type silicon substrate 120 is biased to the power source voltage $V_{DD}$.

In the present embodiment, the PN junction 144 serves as the rectifier element. When the P type well region 146 is at high potential, the PN junction 144 is forwardly biased, so that holes move from the P type well region 146 into the N type high concentration impurity region 148, and the electrons move from the impurity region 148 into the P well regions 146. Part of the electrons penetrate through the P well region 146 to enter the N type silicon substrate. The electrons in the N type semiconductor region become major carriers and their lifetime is short. Accordingly, the carriers do not adversely influence the peripheral circuit.

In the above-mentioned embodiment, the silicon substrate is of N type, but is not limited to it. If the silicon substrate is of P type, the conductivity type of the elements and the polarity of the voltage applied are opposite to those in the case of the N type. If so done, much the same effects as those of the N type case are attained.

Figure 7:
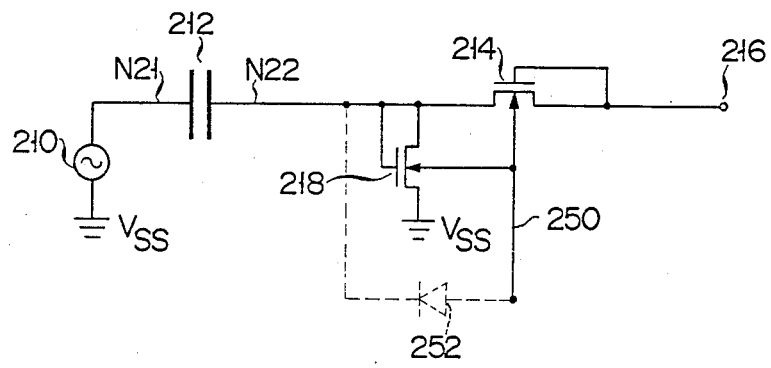
FIG. 7 is a circuit diagram of substrate bias generator used in a fourth embodiment of a semiconductor device according to the present invention.
Figure 8:
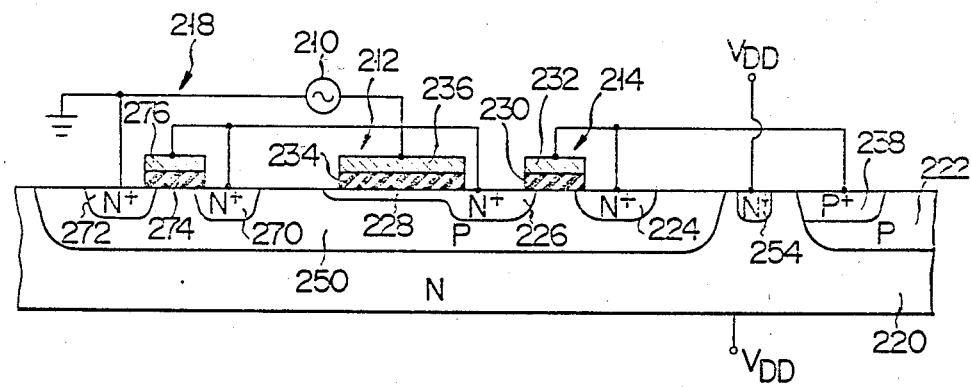
FIG. 8 is a cross sectional view of a fourth embodiment of a semiconductor device according to the present invention.

FIGS. 7 and 8 show a fourth embodiment of a semiconductor device according to the present invention. FIG. 7 illustrates a circuit diagram of a substrate bias generator. The AC voltage generating circuit 210 grounded at one end produces an AC voltage oscillating between the reference voltage $V_{SS}$ and the power source voltage $V_{DD}$. The other end of the generating circuit 210 is connected to a terminal 216 via a capacitor 212 and an N channel MOS transistor 214. The terminal 216 is connected to a semiconductor region to which the voltage generated by the substrate bias generator is to be supplied. A node between the generating circuit 210 and the capacitor 212 is denoted as N21 and a node between the source of the transistor 214 and the capacitor 212 is denoted as N22. The node N22 is connected to the gate and the drain of the N channel MOS transistor grounded at the source. The gate of the N channel MOS transistor 214 is connected to the drain pe se. The substrate region in which the channel of the transistor 214 is formed and the substrate region in which the channel of the transistor 218 is formed are connected together. N chennel MOS transistors 214 and 218 are formed in a P type semiconductor region 250. Formed between the semiconductor region 250 and the node N22 is a PN junction (diode) 252 indicated by a broken line in FIG. 7. The MOS transistors 214 and 218 have a rectifying characteristic. The semiconductor region 250 where the transistors 214 and 218 are formed is separated from the semiconductor region driven by the substrate bias generator.

FIG. 8 shows a cross sectional view of a semiconductor device with a substrate bias generator shown in FIG. 7 according to the present invention. P type well regions 222 and 250 are separately formed on the surface region of an N type silicon substrate 220. A major circuit made up of an N channel transistor is formed in the P type well region 222. N type high concentration impurity regions 224, 226, 228, 270 and 272 are formed in the surface region of the P type well region 250. A gate electrode 232 is formed on the P well region 250 located between the N type regions 224 and 226 with a gate insulating film 230 interposed therebetween. The N type region 224, gate electrode 232 and N type region 226 are the drain, the gate and the source of the N channel MOS transistor 214 in FIG. 7, respectively. A gate electrode 236 is formed on the N type high concentration impurity region 228, with the gate insulating film 234 interposed therebetween. A capacitor 212 is formed by the gate electrode 236, the gate insulating film 234 and the N type high concentration impurity region 228. A gate electrode 276 is formed through a gate insulating film 274 on a P well region 250 between the N type impurity regions 270 and 272. The N type impurity region 270, the gate electrode 276 and the N type impurity region 272 serve as the drain, gate and source of the N channel MOS transistor 218, respectively.

A P type high concentration impurity region 238 for enhancing the ohmic contact and other circuit elements are formed in the other P type well region 222.

The gate electrode 232 of the MOS transistor 214 is connected to the N type impurity region 224 and the P type impurity region 238. The gate electrode 236 of the capacitor 212 is connected by way of the AC voltage generating circuit 210. The gate electrode 276 of the MOS transistor 218 and the N type impurity region 270 of the same are connected to the N type impurity region 226 of the MOS transistor 214. The N type high concentration impurity layer 272 of the MOS transistor 218 is grounded. The power source voltage $V_{DD}$ is supplied to the N type semiconductor substrate 220.

An N type high concentration impurity region 254 to ensure a complete separation between the P well regions 222 and 250 is formed in the surface region of the N type semiconductor substrate 220 sandwiched by the P well regions 222 and 250. The N type impurity region 254 is biased to the power source voltage $V_{DD}$. The impurity region 254 may be formed by an insulating region such as $SiO_2$.

The impurity region 254 is not necessarily provided since the n type silicon substrate 220 is biased to the power source voltage $V_{DD}$. However, the provision of the impurity region 254 is preferable for effectively implementing the present invention.

The operation of the substrate bias generator will be described. An AC voltage at the electrode 236 (node N21) of the capacitor 212 oscillates between the power source voltage $V_{DD}$ and the reference voltage $V_{SS}$ by the AC voltage generating circuit 210. The N type impurity regions 226 and 228 (node N22) electrically oscillates due to electrostatic induction. When the impurity regions 226, 228 and 270 are at high potential, those regions are discharged through the transistor 218. When those regions are at low potential, those are charged through the transistor 214. In this case the impurity regions 226, 228 and 270 and the P well region 250 are forwardly biased, so that electrons are injected into the P well region 250 from the regions 226, 228 and 270. Since the P type well region 250 is in a floating state, it is negatively charged by the injected electrons for a short time. Accordingly, a less amount of the injected electrons is allowed.

Since the silicon substrate 220 is positively biased, even if the injected electrons in the P well region 250 enter the silicon substrate 220, the electrons never enter the negatively biased P well region 222. Further, when the N type impurity region 254 biased to the power source voltage $V_{DD}$ is formed, the electrons diffused toward the P well region 222 from the P well region 250 through the surface region of the N type silicon substrate can be caught. In this case, its effect is much greater. Therefore, the minority carriers generated by the substrate bias generator do not adversely effect the operation of the circuit elements.

Figure 9:
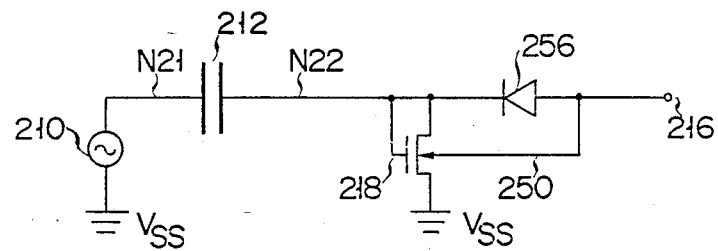
FIG. 9 is a circuit diagram of a substrate bias generator used in a fifth embodiment of a semiconductor device according to the present invention.
Figure 10:
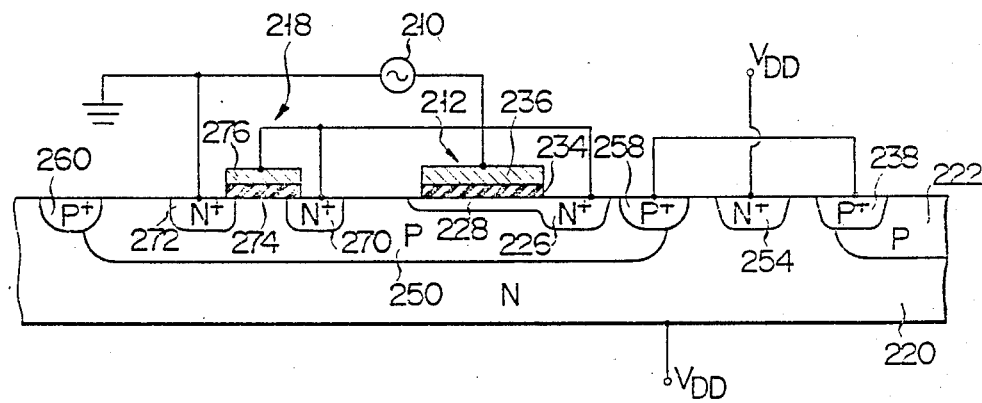
FIG. 10 is a cross sectional view of a semiconductor device which is a fifth embodiment according to the present invention.

A fifth embodiment of a semiconductor device according to the present invention will be described referring to FIGS. 9 and 10. FIG. 9 shows a circuit diagram of a substrate bias generator. FIG. 10 is a cross sectional view of a semiconductor device with the substrate bias generator shown in FIG. 9, which is according to the present invention. The present embodiment employs a diode 256 for the rectifier element. The diode 256 is a PN junction formed by a P well region 250, and N type high concentration impurity regions 226 and 228.

Formed in the P well region 250 formed in the N type silicon substrate 220 are the N type highly concentration impurity regions 226, 228, 270 and 272, and P type high concentration impurity regions 258 and 260 surrounding those impurity regions 226, 228, 270 and 272. The N type impurity region 228 serves as one of the electrodes of the capacitor 212. The P type impurity region 258 is connected to the P well region formed in the substrate 220. The remaining portions of the present invention are same as those of FIG. 8. Accordingly, like numerals are used for designating like portions and no explanation will be given.

When the N type impurity region 226, 228 and 270 are at low potential by the AC voltage generating circuit 210, electrons flows from the impurity regions 226, 228 and 270 into the P well region 250. It is preferable that the electrons in P type region are removed fast. To this end, the region in which the electrons recombine fast, that is, the P type high concentration impurity regions 258 and 260, are preferably formed close to and around the impurity regions 226, 228 and 270. In order to drive the recombination of electrons, it is advisable to diffuse impurity to provide the recombination center such as gold (Au) into the P well region 250.

There is a case that the electrons injected into the P well region 250 enter the silicon substrate 220. In this case, however, those never enter the P well region 222 having the major circuits formed therein since the silicon substrate 220 is positively biased. Therefore, the eroneous operation of the circuit elements never occur.

In the above embodiment, the P well regions 222 and 250 are formed into the N type silicon substrate 220. A P type epitaxial layer may be formed on the N type silicon substrate.

Alternatively, the conductivity type of the well regions and circuit elements may be set to the opposite to that of those in FIGS. 8 and 9, and the polarity of the voltage applied may be inversed.

What we claim is:

1. A substrate bias generator comprising:
a semiconductor substrate;
a first semiconductor region of a first conductivity type existing in said semiconductor substrate, said semiconductor region supplied with a first potential;
a capacitive element formed in said first semiconductor region, said capacitive element including a second semiconductor region as a first electrode and a conductive means formed on said second semiconductor region as a second electrode with an insulation film interposed therebetween;
a MOS transistor formed in said first semiconductor region serving as a first rectifying element, said MOS transistor including source and drain regions of a second conductivity type so as to establish a PN junction between said semiconductor region and said source and drain regions, said MOS transistor further including a gate electrode formed on said first semiconductor region between said source and drain regions with an insulation film interposed therebetween;
a second rectifying element formed in said first semiconductor region having first and second terminals, said first terminal supplied with a second potential;
a third semiconductor region of the second conductivity type existing in said semiconductor substrate, in which circuit elements are formed;
voltage supply means for supplying an AC voltage to one of said first and second electrodes of said capacitive element;
first means for connecting together the other one of said first and second electrodes of said capacitive element, said gate electrode of said MOS transistor, one of said source and drain regions of said MOS transistor, and said second terminal of said rectifying element;
second means for connecting said third semiconductor region to the other one of said source and drain regions of said MOS transistor, whereby said PN junction formed between said first semiconductor region and said source and drain regions is reversebiased during operation of said substrate bias generator.

2. A substrate bias generator according to claim 1, wherein said first semiconductor region and said semiconductor substrate have the same conductivity types.

3. A substrate bias generator according to claim 2, wherein said first conductivity type is an N type and said second conductivity type is a P type.

4. A substrate bias generator according to claim 3, wherein said third semiconductor region is a P-well formed in said semiconductor substrate.

5. A substrate bias generator according to claim 1, wherein said second semiconductor region is of a second conductivity type and is integral with one of the said source and drain regions of said MOS transistor.

6. A substrate bias generator according to claim 5, wherein said AC voltage supply means is connected to said conductive means of said capacitive element.

7. A substrate bias generator according to claim 1, wherein said second rectifying element is a MOS transistor having one of said source and drain regions and a gate electrode supplied with the second reference potential, said source and drain regions being formed in said first semiconductor region and having the second conductivity type.

8. A substrate bias generator according to claim 1, wherein said second rectifying element is a diode including a fourth semiconductor region connected to said second semiconductor region of said capacitive element and one of the source and drain regions of said MOS transistor and a fifth semiconductor region of the first conductivity type, said fifth semiconductor region being supplied with the second potential.

9. A substrate bias generator according to claim 1, wherein the other one of said source and drain regions of said MOS transistor is formed integrally with said third semiconductor region.

* * * * *